United States Patent [19]

Ross et al.

[11] 4,005,437

[45] Jan. 25, 1977

[54] METHOD OF RECORDING INFORMATION IN WHICH THE ELECTRON BEAM SENSITIVE MATERIAL CONTAINS 4,4'-BIS(3-DIAZO-3-4-OXO-1-NAPHTHALENE SULFONYLOXY)BENZIL

[75] Inventors: Daniel Louis Ross, Princeton; Lucian Anthony Barton, Trenton, both of N.J.

[73] Assignee: RCA Corporation, New York, N.Y.

[22] Filed: Apr. 18, 1975

[21] Appl. No.: 569,399

[52] U.S. Cl. .............................. 346/165; 96/124; 96/35.1; 96/36; 96/36.2; 96/75; 96/91 D; 96/115 R; 260/141; 346/158; 346/159; 346/161; G11B/9/00

[51] Int. Cl.² ................ C07C 113/00; G01D 15/06

[58] Field of Search ............ 260/141 D; 96/1 LY, 96/35.1, 36, 75, 91 D, 115 R, 36.2; 346/74 E, 74 CR, 74 CH; 360/3

[56] References Cited

UNITED STATES PATENTS

| | | | |
|---|---|---|---|
| 2,636,022 | 4/1953 | Brooks et al. | 260/141 X |
| 2,975,053 | 3/1961 | Schmidt et al. | 260/141 X |
| 3,046,110 | 7/1962 | Schmidt | 260/141 X |
| 3,046,118 | 7/1962 | Schmidt | 260/141 X |
| 3,046,119 | 7/1962 | Sus | 260/141 X |
| 3,130,048 | 4/1964 | Fritz et al. | 260/141 X |
| 3,301,698 | 1/1967 | Fauser et al. | 117/37 LE |
| 3,634,086 | 1/1972 | Lawson et al. | 96/49 |
| 3,703,400 | 1/1972 | Tamai et al. | 117/37 L |
| 3,717,461 | 2/1973 | Honjo | 96/1 LY |
| 3,852,771 | 12/1974 | Ross et al. | 260/141 X |

*Primary Examiner*—Floyd D. Higel
*Attorney, Agent, or Firm*—Glenn H. Bruestle; Birgit E. Morris

[57] ABSTRACT

Recording media comprising a mixture of 4,4'-bis(3-diazo-3,4-dihydro-4-oxo-1-naphthalenesulfonyloxy)-benzil and an alkali soluble resin are suitable for recording information with electron beams. These recording media have high sensitivity, high resolving power and can be reproducibly formulated.

5 Claims, No Drawings

METHOD OF RECORDING INFORMATION IN WHICH THE ELECTRON BEAM SENSITIVE MATERIAL CONTAINS 4,4'-BIS(3-DIAZO-3-4-OXO-1-NAPHTHALENE SULFONYLOXY)BENZIL

This invention relates to novel electron beam recording media. More particularly, this invention relates to a novel sensitizer for electron beam recording media, which media have excellent resolution and high sensitivity.

BACKGROUND OF THE INVENTION

Organic materials commonly referred to as photoresists are recording media on which information can be recorded in the form of a surface relief pattern. Such media, when exposed to a light pattern, change their solubility characteristics in those areas struck by the light. Photoresists may be developed by contacting them after exposure with a solvent which dissolves the more soluble portions, leaving the less soluble portions in a relief pattern which corresponds to the information contained in the light pattern. Negative photoresists are initially soluble in the developer solution and the exposed portions become insolubilized. Positive photoresists are initially insoluble and become soluble in the exposed portions.

Recently, suitably modulated electron beams have also been utilized for recording information in the form of relief patterns. Electron beams, by virtue of their shorter effective wavelengths and greater depth of focus, can thus record information at higher resolution or density than can light beams.

Several materials that are known to be photosensitive are also sensitive to electron beams. Among these are certain members of a class of naphthoquinone-(1,2-)diazide sulfonic acid esters which have the general formula:

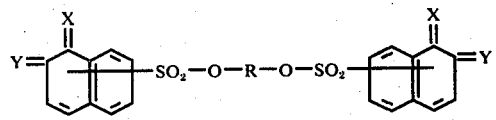

wherein X and Y are $N_2$ or O and R is selected from certain aryl, substituted aryl or heterocyclic radicals. These compounds are disclosed, for example, in U.S. Pat. No. 3,046,118. These light sensitive esters are admixed with an alkali-soluble resin to form a photoresist composition.

The compound having the formula:

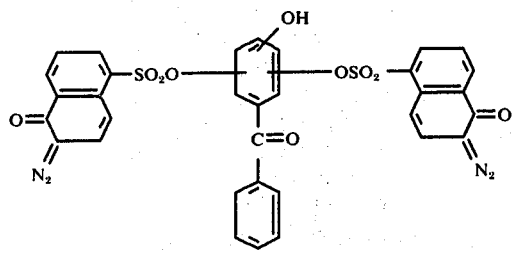

in admixture with the corresponding monoester and triester byproducts, combined with a cresol-formaldehyde resin available as Alnovol 429-K from Chemische Werke Albert, of Wiesbaden-Biebrich, Germany, is available commercially as AZ 1350 photoresist from the Shipley Co. This material, while effective as an electron beam resist, has deficiencies in reproducibility and sensitivity.

Another compound of this type which has improved sensitivity to electron beam after suitable purification has been disclosed by Ross et al., in U.S. Pat. No. 3,852,771. The electron beam sensitive compound has the formula:

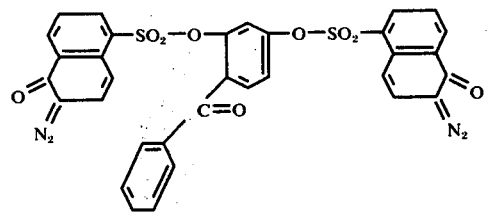

Since a high degree of purity and batch-to-batch reproducibility is required for electron beam recording media of consistent performance, this compound is purified, preferably by a reprecipitation step followed by recrystallization step. Various other compounds of this series have also been tried as sensitizers for electron beam resists, but have been found to be unsatisfactory, either because of low sensitivity; because the compounds cannot be purified to the required level; or because the compounds, after purification, have been too insoluble in the inert solvents which have satisfactory release properties for the spinning of high quality films having good uniformity and smoothness.

SUMMARY OF THE INVENTION

We have discovered a new compound which, when admixed with an alkali-soluble resin, forms a highly sensitive electron beam resist. The active compound is a benzil derivative, 4,4'-bis(3-diazo-3,4-dihydro-4-oxo-1-naphthalenesulfonyloxy)benzil which has the formula

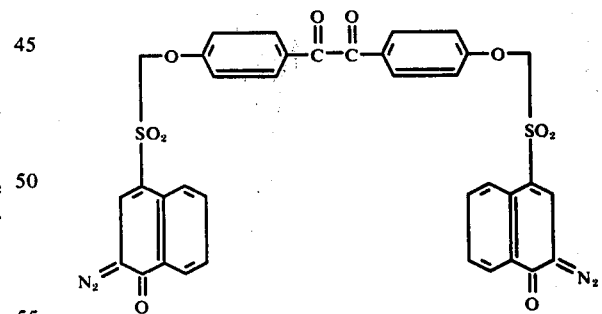

This compound can be purified to permit the formulation of a recording medium having reproducible properties, and, after purification, is soluble in solvents conventionally employed for electron beam resist formulations.

DETAILED DESCRIPTION OF THE INVENTION

The novel electron beam sensitive compound described above can be prepared by reacting 2 mols of 2-diazo-1-naphthol-4-sulfonyl chloride with 1 mol of 4,4'-dihydroxybenzil in the presence of a base. When reaction is complete, the reaction mixture is neutralized to precipitate the crude ester compound which is then collected.

The crude ester compound is then purified by reprecipitation and recrystallization in order to remove by-products and other impurities so as to be able to prepare an electron beam resist having good reproducibility. The crude ester compound can be dissolved in a solvent, such as ethyl acetate, and reprecipitated with another solvent, such as cyclohexane and then recrystallized from a solvent, such as acetic acid, acetonitrile, methyl isobutyl ketone or the like. The crude product can also be dissolved in certain solvents and the solution allowed to stand until a product which can be subsequently recrystallized precipitates out.

An electron beam resist composition is prepared by admixing the benzil derivative described above with an alkali-soluble resin. Such resins include novolak resins, cellulose derivatives, homopolymers and copolymers of vinyl acetate and the like. The preferred resins are novolaks prepared from phenols and aldehydes, most preferably a cresol-formaldehyde resin. The mixture of benzil derivative and the resin can contain from about 1 to 50% by weight of the benzil derivative, preferably about 1 to 25% by weight. When using certain relatively low molecular weight cresol-formaldehyde novolak resins having a melting range of about 108° to 118° C., the best results are obtained when from about 12 to 20% by weight of the benzil derivative in the mixture is employed.

Preferably the formulated recording medium is dissolved in a solvent and applied to a support. Suitable solvents have vapor pressures and polarities which enable high quality films of good uniformity, smoothness, and adhesion to be applied to the substrate. The presently preferred solvent is 2-methoxyethyl acetate. The concentration of the benzil derivative-resin mixture in the solvent is adjusted so as to deposit, upon evaporation of the solvent, the desired thickness of the electron beam sensitive composition on the support.

The support can be conventional. Suitable supports can be flexible, such as polyethylene terephthalate tape, or inflexible, such as a metal or glass plate; and can be transparent or opaque, depending on the requirements of the recording system in which it is to be employed. For electron beam recording, the support or substrate should be conductive. In the event the substrate is non-conducting, a thin conductive film can be applied either to the support prior to coating with the electron beam sensitive formulation or applied onto the surface of the prepared electron beam resist film. This conductive film can be, for example, a metallic film a few hundred angstroms thick of nickel or nickel-chromium alloy.

The solution of the benzil derivative-resin mixture is applied to the desired substrate in a conventional manner, as by dipping, roller coating, spraying, spinning or the like, and is then dried to remove the solvent. Drying can be carried out by allowing the solvent to evaporate at room temperature or at elevated temperatures either in air or in an inert atmosphere.

After exposure of the recording medium to a suitably modulated and deflected electron beam, the exposed surface is treated with a developer solvent, which can be any mildly alkaline aqueous solution, such as a dilute solution of an alkali metal hydroxide, phosphate, silicate or the like.

The optimum developing time for the recording medium will vary depending on the pH of the developer solvent, the temperature, the drying conditions and the ratio of the benzil derivative to resin, and can be readily determined from a series of test runs by one skilled in the art.

The recording media disclosed herein have excellent sensitivity. They can be employed as positive-working etch resists, by exposing films having a thickness equal to or less than the depth of penetration of the electron beam and developing to expose the substrate. Alternatively, they can be employed as media for recording of surface relief patterns by exposing thicker films to form well defined patterns which, upon developing, correspond to the information recorded. The recording media are particularly useful in those application such as video disc manufacture where it is desired to form a thin, conformal coating of electron beam resist on a non-smooth, or grooved, substrate. Because of the excellent solubility of the present purified benzil derivative in solvents having good release properties, smooth, uniform, high quality films can be applied to uneven substrates.

The invention will be further illustrated by the following example, but the invention is not limited to the details described therein.

EXAMPLE 1

Part A — Preparation and purification of 4,4'-bis(3-diazo-3,4-dihydro-4-oxo-1-naphthalenesulfonyloxy)-benzil.

A solution containing 29.6 grams of 2-diazo-1-naphthol-4-sulfonyl chloride and 12.1 grams of 4,4'-dihydroxybenzil in 200 milliliters of dry pyridine was stirred for 30 minutes and allowed to stand for 84 hours at room temperature. The resultant mixture was then poured slowly into 3 liters of ice water containing 200 milliliters of concentrated HCl. The mixture was stirred for 30 minutes, and the resultant precipitate collected by filtration. The precipitate was washed first with 500 milliliters of 3.6% by weight HCl and then with 1 liter of water and dried under vacuum. A yield of 29.3 grams of the crude product was obtained.

The product was purified by two alternative procedures:

a. Ten grams of the crude product obtained above were dissolved by stirring with 100 milliliters of ethyl acetate for 30 minutes. The solution was filtered to remove insolubles and the filtrate added slowly to 500 milliliters of cyclohexane to precipitate the product. A yield of 8.3 grams of dried precipitate was collected and was recrystallized from acetonitrile.

b. 3.1 Grams of the crude product obtained above were dissolved in 25 milliliters of acetic acid at room temperature and filtered to remove insolubles. After standing for 5 days, an amorphous precipitate was formed which was collected by filtration and dried. A yield of 1.45 grams of product was recovered. The product was recrystallized by dissolving 1.0 gram in 20 milliliters of hot methylisobutyl ketone, cooling to room temperature, diluting the solution with 2 milliliters of ethyl ether, filtering the cloudy solution obtained and allowing it to crystallize at room temperature. The resultant crystalline precipitate had a melting point of about 270° C. with decomposition. Elemental analysis was as follows:

Calculated for $C_{34}H_{18}S_2N_4O_{10}$, % by weight C, 57.79; H, 2.55; N, 7.93; S, 9.07. Found, % by weight: C, 57.55; H, 2.72; N, 8.25; S, 8.98.

The purified compound is soluble (about 7.26 grams/100 milliliter) in 2-methoxyethyl acetate.

Part B — Preparation and Testing of Electron Beam Resist

136 Grams of the purified benzil derivative prepared as in Part A (b) and 864 grams of a cresol-formaldehyde novolak resin, Alnovol 429K, were dissolved in 2-methoxyethyl acetate to form a solution containing 15% by weight of solids.

A film about one micron thick was spun from the above solution onto a grooved copper master disc. The coated disc was baked in an oven at 50° C. for 17 hours and given line exposures, transverse to the groove, to the beam of an electron beam recording apparatus at an acceleration potential of 10 keV. This method of recording is described for example in U.S. Pat. No. 3,842,194 to Clemens. The Gaussian-shaped beam, having a width at one-half amplitude of about 0.2 micron, was scanned according to predetermined test patterns on the surface of the films at several beam currents so as to give exposures of $1.7 \times 10^{-6}$, $2.5 \times 10^{-6}$ and $3.25 \times 10^{-6}$ coulomb/cm$^2$ at each of the wavelengths corresponding to 6.9, 1.6, 1.1 and 0.67 microns.

The exposed film was zone developed in alkaline solution using an undiluted developer commercially available as Azoplate AZ Developer for AZ 1350 Photoresist from the Shipley Co. for a range of times from 150 to 270 seconds. The film was then washed with water and dried.

The signal elements produced were examined by scanning electron microscopy. The width and depth of the individual elements of the developed pattern of each exposure and wavelength were measured and the relative sensitivity determined.

The relative sensitivity, as employed herein, is related to the amount of material removed, after development, for a given electron beam exposure. However, with the types of positive recording media described herein, even the unexposed areas have a definite, although low, solubility in the developers employed. Thus the relief formed on exposure and development is a function of the difference in solubility between the exposed and unexposed regions. The relative sensitivity of various recording media is determined by measuring the net relief formed as a function of electron beam exposure.

The results, analyzed in terms of producing a 0.55 micron trench (1.1 micron wavelength) having a depth of 800 angstroms are summarized below:

| Exposure, coulombs/cm$^2$ | Development Time, Seconds |
|---|---|
| 3.25 | 150 |
| 2.5 | 185 |
| 1.7 | 282 |

This material has a useful sensitivity of at least $1.7 \times 10^{-6}$ coulombs/cm$^2$.

COMPARATIVE EXAMPLE — Part A

A compound having a structure similar to the benzil derivative of Example 1 except derived from a benzophenone compound and having the structure:

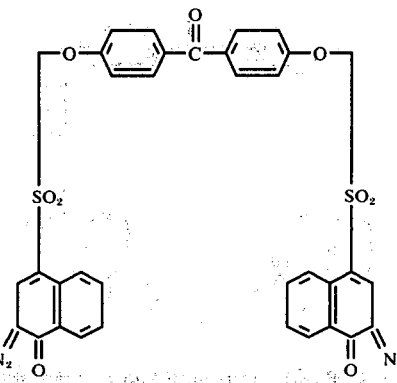

was prepared and purified as in Example 1. This compound, after recrystallization, has a solubility of only about 0.25 gram per 100 milliliter of 2-methoxyethyl acetate, which is below that useful for preparing electron beam resists. This compound is soluble in dimethylformamide, however, and a formulation (A) was prepared by admixing 15 grams of the ester compound with 85 grams of Alnovol 429K and dissolving in a mixture of 40:60 dimethylformamide/2-methoxyethyl acetate to a solids content of 17.5% by weight. A second formulation (B) was made in similar manner employing the diester of Example 1. The formulations were deposited by spinning the solutions onto glass slides coated with a thin chromium-nickel alloy. The coated slides were baked at 50° C. for 1 hour. The resultant films were rather non-uniform, a result due to the presence of dimethylformamide in the solvent mixture from which the films were made.

The films were exposed to the beam of a scanning electron microscope at an accelerating potential of 10 keV and a beam current of $3 \times 10^{-9}$ amperes. The Gaussian-shaped beam, having a width at one-half amplitude of 0.28 micron, was scanned to describe a raster exposure from $3 \times 10^{-6}$ to $16 \times 10^{-6}$ coulombs/cm$^2$ by varying the scanning speed. The exposed films were developed with the Azoplate AZ Developer as in Example 1 (diluted with 25% by weight of water in the case of formulation A) for 140 seconds for formulation A and for 75 seconds for formulation B, which gave approximately the same trench geometries for the respective formulations. The width and depth of the developed trenches were plotted and the points where width/depth = 1, where width and depth were less than 0.5 micron, were determined. The sensitivity for formulation A was $7.25 \times 10^{-6}$ coulombs/cm$^2$ and that for formulation B was $8.0 \times 10^{-6}$ coulombs/cm$^2$.

Part B

The ester of another quinone diazide was prepared and purified by reprecipitation and recrystallization as in Example 1 except substituting the appropriate sulfonyl chloride starting material. This compound has the structure:

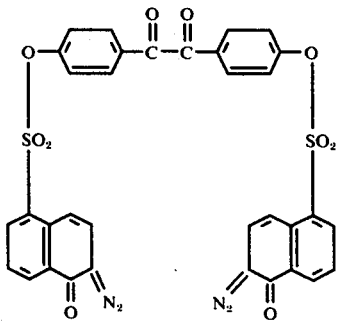

The recrystallized compound was so insoluble that it could not be evaluated in an electron beam resist formulation.

Part C

The quinone diazide naphthalene sulfonyl chloride as in Example 1 was reacted with 3,3'-dihydroxybenzil and the resultant ester purified by reprecipitation and recrystallization as in Example 1. This compound has the structure:

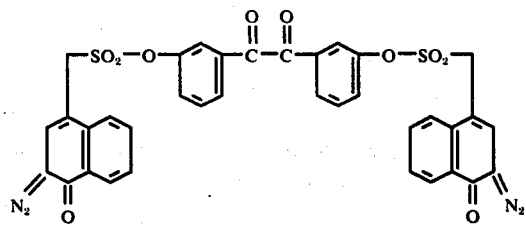

The recrystallized compound was so insoluble that it could not be evaluated in an electron beam resist formulation.

Thus recrystallized compounds having structures very similar to the compound of the present invention have surprisingly different solubility properties which make then unsuitable for preparing electron beam resists.

We claim:

1. In a method of recording information whereby a modulated beam of electrons is scanned across a surface of an electron beam sensitive material which becomes more soluble in a developer solvent when impinged upon by a beam of electrons and the electron beam sensitive material is developed with a developer solvent so as to remove the solubilized portion, the improvement which comprises employing as the electron beam sensitive material a mixture containing from about 1 to about 50% by weight of an active compound of the structure

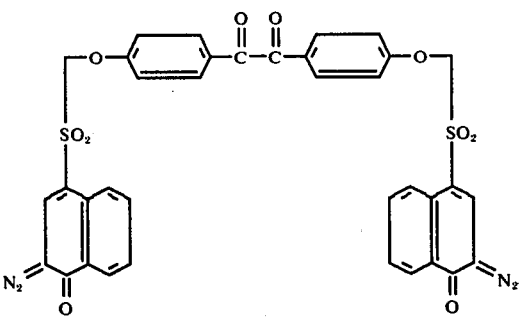

and an alkali-soluble resin.

2. A method according to claim 1 wherein the alkali-soluble resin is selected from the group consisting of novolaks, cellulose derivatives and homopolymers and copolyers of vinyl acetate.

3. A method according to claim 1 wherein the alkali-soluble resin is a novolak resin.

4. A method according to claim 1 wherein the alkali-soluble resin is a cresol-formaldehyde novolak resin.

5. A method according to claim 4 wherein the mixture contains from about 10 to 20% weight of the active compound.

* * * * *